US012689376B2

(12) United States Patent
Mangalore Anand et al.

(10) Patent No.: US 12,689,376 B2
(45) Date of Patent: Jul. 21, 2026

(54) SYSTEMS AND METHODS FOR HIGH-VOLTAGE-TOLERANT LEVEL SHIFTERS

(71) Applicant: Advanced Micro Devices, Inc., Santa Clara, CA (US)

(72) Inventors: Rajesh Mangalore Anand, Bangalore (IN); Aniket Bharat Waghide, Bangalore (IN); Girish Anathahalli Singrigowda, Bangalore (IN); Jagadeesh Anathahalli Singrigowda, Bangalore (IN); Prasant Kumar Vallur, Hyderabad (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 403 days.

(21) Appl. No.: 18/300,171

(22) Filed: Apr. 13, 2023

(65) Prior Publication Data

US 2025/0279780 A1      Sep. 4, 2025

(51) Int. Cl.
*H03K 19/0185* (2006.01)

(52) U.S. Cl.
CPC ............................ *H03K 19/018521* (2013.01)

(58) Field of Classification Search
CPC ............................................... H03K 19/018521
USPC ......................................................... 327/333
See application file for complete search history.

(56) References Cited

U.S. PATENT DOCUMENTS

| | | | | |
|---|---|---|---|---|
| 11,646,737 B1 * | 5/2023 | Chan | ................ | H03K 19/00361 |
| | | | | 327/333 |
| 2013/0113541 A1 * | 5/2013 | Crespi | .............. | H03K 3/356182 |
| | | | | 327/333 |
| 2020/0244252 A1 * | 7/2020 | Kim | ................... | H03K 19/0185 |

* cited by examiner

*Primary Examiner* — Tomi Skibinski
(74) *Attorney, Agent, or Firm* — Greenberg Traurig, LLP

(57) ABSTRACT

The disclosed device for high-voltage-tolerant level shifters can include a level shifter device configured to shift an input signal from an input voltage range to an output voltage range, where a span from a bottom of the input voltage range to a top of the output voltage range is greater than a voltage differential tolerance of any of the plurality of transistors. Various other devices and systems are also disclosed.

20 Claims, 5 Drawing Sheets

200

SYSTEMS AND METHODS FOR HIGH-VOLTAGE-TOLERANT LEVEL SHIFTERS

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1B:
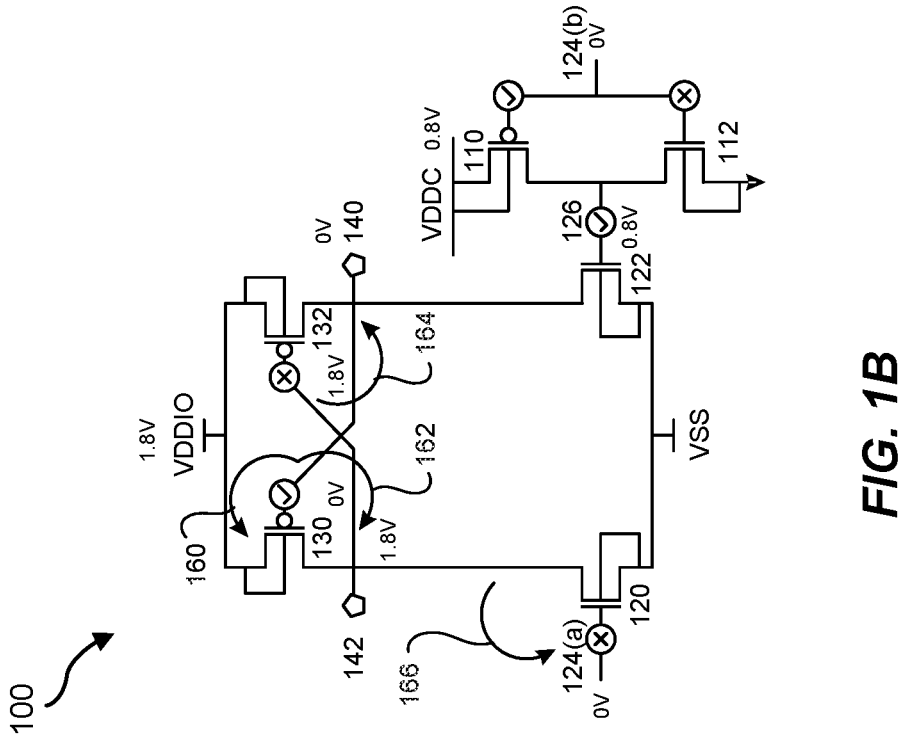
FIG. 1B is a diagram of the example level shifter of FIG. 1A in a second state.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE IMPLEMENTATIONS

The present disclosure is generally directed to devices and systems for high-voltage-tolerant voltage level shifters. Advancements in computing hardware continue to put pressure on increasing processing power, increasing power efficiency, increasing component density, reducing cost, and increasing reliability. Reducing the minimum feature size of transistors can advance these objectives. However, devices conforming a smaller feature size may have other limitations. For example, a device with a smaller feature size may have a lower tolerance of voltage differential across the device. Thus, for example, I/O devices with a 6 nanometer (nm) technology node minimum feature size may be 1.8 volt (V) tolerant, while the same I/O devices with a 5 nm technology node minimum feature size may only be 1.5 V tolerant. An attempt to use 1.5 V tolerant I/O devices in a high-voltage application (e.g., relating to the I/O voltage domain signal, which may span from 0 V to 1.8 V) may result in over-voltage stress on the 1.5 V tolerant devices.

A voltage level converter circuit (or "level shifter") may convert a signal from a source voltage domain to a destination voltage domain in a multi-voltage domain system. Devices and systems described herein may include high-voltage tolerant level shifters that help to eliminate over-voltage stress issues that would otherwise be experienced by low-voltage-tolerant transistors when operating in high-voltage applications.

For example, one or more of the devices described herein may be implemented as a level shifter composed of (and, e.g., interoperating with) 5 nm technology node and I/O devices that converts a Core voltage domain signal (e.g., about 0 V to 0.8 V) to an I/O voltage domain signal (e.g., about 0 V to 1.8 V) where the voltage tolerance of the 5 nm technology node and I/O devices is less than 1.8 V (e.g., 1.5 V). However, as will be explained in greater detail below, the level shifter described herein may successfully convert a signal from the Core domain to the I/O domain without over-voltage stress to the 5 nm technology node and I/O devices.

In addition, in some examples, the level shifter devices described herein may be relatively simple, space efficient, high performance, and/or power efficient. For example, one or more of the level shifter devices described herein may optionally avoid and/or exclude elements that may consume a significant amount of area, such as operational amplifiers, resistors, and diodes. Furthermore, these level shifter devices may optionally avoid and/or exclude the use of techniques that may demand more static power and, thus, be less power efficient, such as intermediate voltage generation or biasing. Furthermore, these level shifter devices may optionally avoid and/or exclude approaches that may degrade the performance of the circuit, such as device-stacking techniques that limit the voltage across any two terminals of a device and may thereby degrading performance during high-speed switching.

Furthermore, one or more of the level shifter devices described herein may mitigate device reliability issues, such as gate-oxide breakdown, which may be caused due to the application of a high voltage at gate terminals of devices beyond their tolerance limits. Additionally, in some examples, one or more of these level shifter devices may avoid leakage current and/or latch-up, by, for example, bulk connections that avoid forward-biased parasitic diodes in the transistors. Moreover, one or more of these level shifter devices may minimize contention by avoiding any static current paths in the circuit while switching. In addition, one or more of these level shifter devices may provide a balanced rise/fall slew at the output, thereby making them suitable to work in both the data path and the clock path at high frequencies (e.g., several hundreds of megahertz (MHz)). Furthermore, these level shifter devices may be useful for a wide range of Core voltage domains (e.g., including, without limitation, Core domains with maximums ranging anywhere from 0.6 V to 1.25 V) and I/O voltage domains (e.g., including, without limitation, I/O domains with maximums ranging anywhere from 1.62 V to 1.98 V).

Figure 1A:
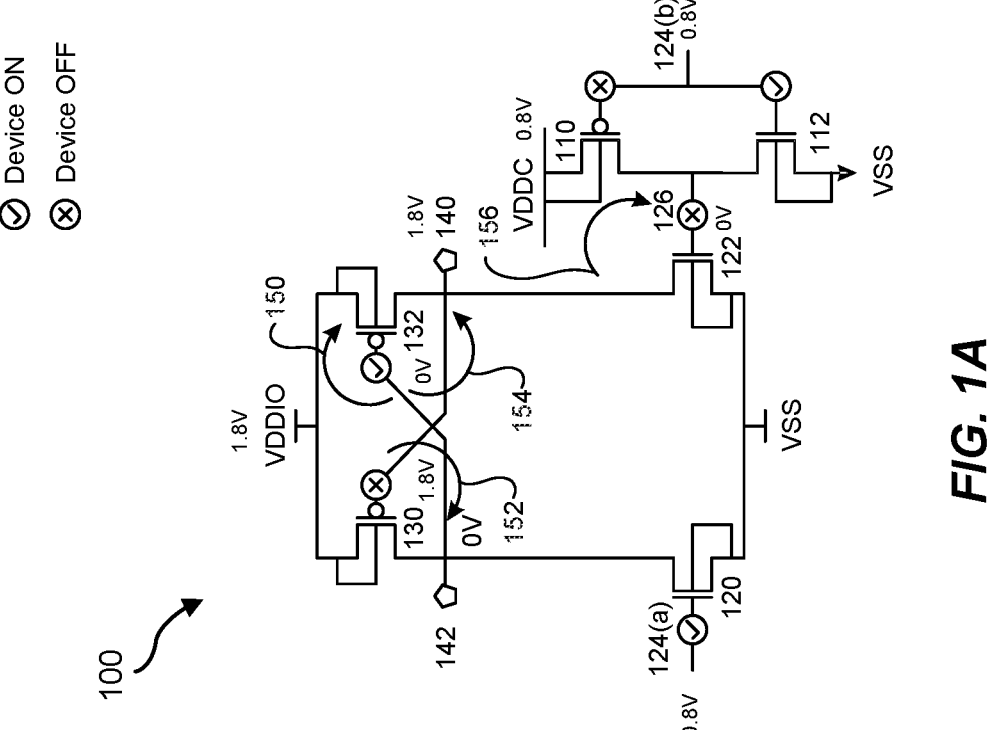
FIG. 1A is a diagram of an example level shifter in a first state.

FIGS. 1A and 1B are diagrams of an example level shifter 100 in two states of operation. By way of example, level shifter 100 may be placed in a context to shift from a Core domain (0-0.8 V) to an I/O domain (0-1.8 V). In addition, the transistors of level shifter 100 may be implemented in 5 nm technology node, and may have a voltage tolerance of 1.5 V. Thus, FIGS. 1A and 1B illustrate ordinary consequences to an example level shifter implemented in 5 nm technology node.

As shown in FIGS. 1A and 1B, level shifter 100 may include various transistors. In some examples, transistors illustrated and/or described herein may be field-effect transistors (FETs). For example, transistors illustrated and/or described herein may be metal-oxide-semiconductor FETs (MOSFETs). In some examples, a MOSFET may be a p-type MOSFET (PMOS) or an n-type MOSFET (NMOS). For example, level shifter 100 may include PMOS devices 110, 130, and 132 and NMOS devices 112, 120 and 122. Level shifter 100 may also include inputs 124(a) and 124(b) and outputs 140 and 142. Devices 110 and 112 may act as input inverters, resulting in an inverted input 126. The pair of PMOS devices 130 and 132 may be cross-coupled.

In the first case, shown in FIG. 1A, an input of 0.8 V may be provided to level shifter 100 (at inputs 124(*a*) and 124(*b*)). The node above input 124(*a*) may be pulled down to 0 V. Thus, device 132 may experience a voltage differential 150 of |0 V-1.8 V|=1.8 V, and another voltage differential 154 of |0 V-1.8 V|=1.8 V, each greater than the voltage differential tolerance of 1.5 V. Similarly, where input 124(*b*) is 0.8 V, inverted input 126 may be 0 V. Thus, device 122 may experience a voltage differential 156 of |0 V-1.8 V|=1.8 V, greater than the voltage differential tolerance of 1.5 V. In addition, device 130 may experience a voltage differential 152 of |1.8 V-0 V|=1.8 V, greater than the voltage differential tolerance of 1.5 V.

In the second case, shown in FIG. 1B, an input of 0 V may be provided to level shifter 100 (at inputs 124(*a*) and 124(*b*)). Thus, device 130 may experience a voltage differential 160 of |0 V-1.8 V|=1.8 V, and another voltage differential 162 of |0 V-1.8 V|=1.8 V, each greater than the voltage differential tolerance of 1.5 V. Similarly, where input 124(*b*) is 0 V, inverted input 126 may be 0.8 V. Thus, device 132 may experience a voltage differential 164 of |1.8 V-0 V|=1.8 V, greater than the voltage differential tolerance of 1.5 V. In addition, device 120 may experience a voltage differential 166 of |0 V-1.8 V|=1.8 V, greater than the voltage differential tolerance of 1.5 V.

Thus, as can be appreciated from the foregoing, devices of level shifter 100 may experience electrical over-stress during typical operation.

Figure 2:
FIG. 2 is a diagram of an example high-voltage-tolerant level shifter.
Figure 2:
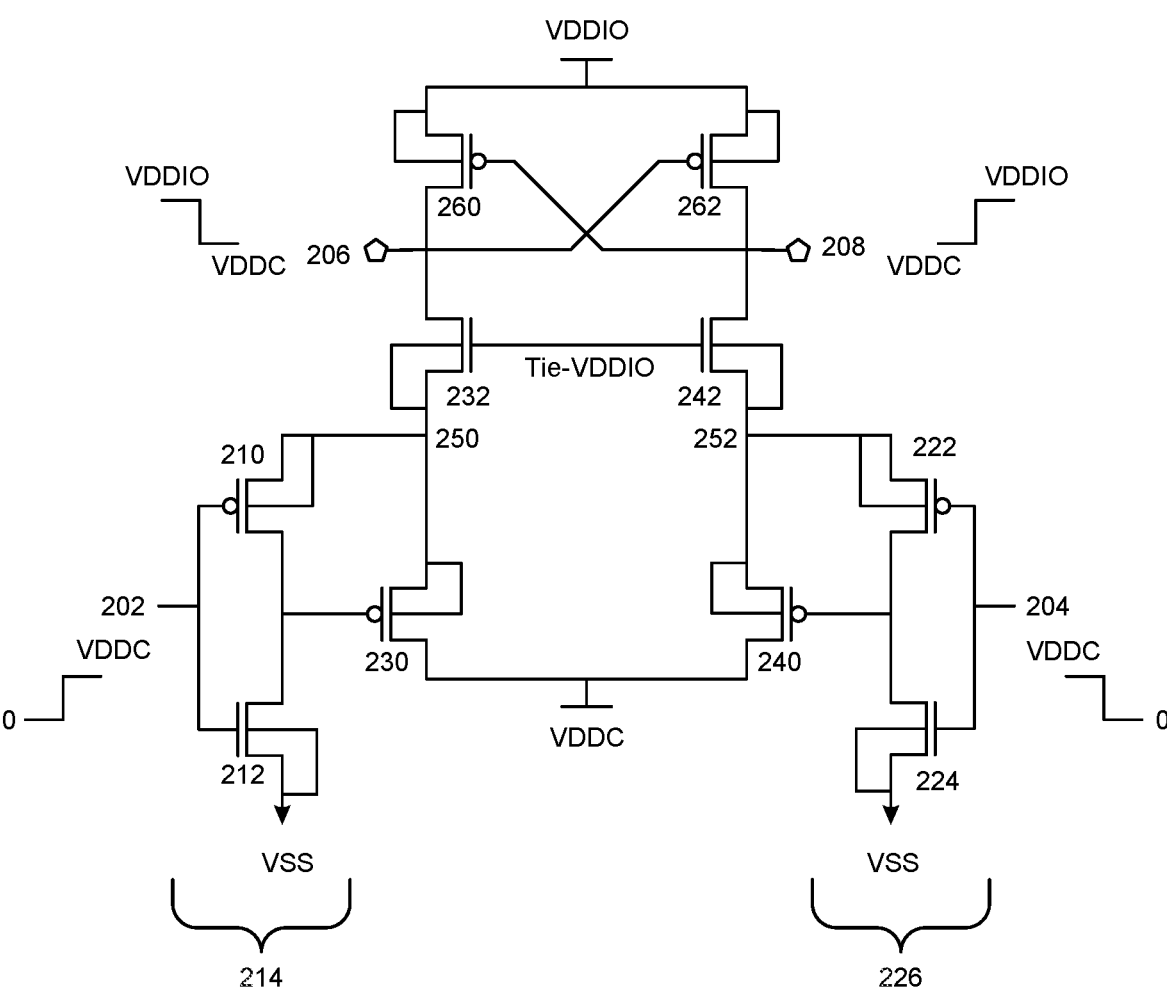

FIG. 2 is a diagram of an example high-voltage-tolerant level shifter 200. As shown in FIG. 2, level shifter 200 may include various transistors. For example, level shifter 200 may include PMOS devices 210, 222, 230, 240, 260, and 262. In addition, level shifter 200 may include NMOS devices 212, 224, 232, and 242. Level shifter 200 may also include an input 202, an inverted input 204, an output 208, and an inverted output 206. Devices 210 and 212 may form a part of an input buffer stage 214 and devices 222 and 224 may form a part of an input buffer stage 226. Devices 260 and 262 may be cross-connected, and devices 230 and 240 may act as a driving pair of devices that drive nets 250 and 252. In some examples, devices 232 and 242 may have a high threshold voltage (Vt). For example, devices 232 and 242 may have a high channel length, resulting in a higher threshold voltage. Additionally or alternatively, devices 232 and 242 may represent stacked devices, resulting in a higher threshold voltage.

As shown in FIG. 2, the input voltage range of level shifter 200 may correspond to the Core voltage domain— e.g., from 0 V (ground) to VDDC, and the output voltage range of level shifter 200 may be from VDDC to the I/O voltage domain (VDDIO). Thus, level shifter 200 may handle both the input voltage range of 0 V to VDDC and the output voltage range of VDDC to VDDIO. Taking, by way of example, VDDC to be 0.8 V and VDDIO to be 1.8 V, the total span of the voltage ranges handled by level shifter 200 may be 1.8 V. Nevertheless, in some examples, each of the devices of level shifter 200 may be individually tolerant to only a voltage difference less than 1.8V. For example, the devices of level shifter 200 may be of a 5 nm technology node or lower design, and may only be tolerant to a voltage differential of 1.5 V.

As can be seen in FIG. 2, and in contrast to the design of level shifter 100 of FIGS. 1A and 1B, the source terminals of devices 230 and 240 may be connected to VDDC (the input voltage domain). By way of example, the maximum voltage level of the Core voltage domain may be 0.8 V. Thus, as will be explained in greater detail below, as devices 230 and 240 drive nets 250 and 252, no device in level shifter 200 will experience a greater voltage differential greater than 1.5 V.

In some examples, and in contrast to the design of level shifter 100, the source and the bulk of device 210 may connect to a drain net 250 (which is connected to the drain of device 230). Likewise, the source and the bulk of device 222 may connect to a drain net 252 (which is connected to the drain of device 240). This configuration may help to keep the parasitic bulk diode of devices 210 and 222 in a reverse bias condition and avoid any undesired flow of current in the substrate. In addition, this configuration may avoid power sequencing scenarios where VDDC is present and the Input/ Output voltage source (VDDIO) is absent, or where VDDIO is present and VDDC is absent. By not connecting the source and bulk of devices 210 and 222 directly to VDDC, level shifter 200 may avoid stress situations in power sequencing scenarios. Thus, level shifter 200 may be power sequencing independent.

Figure 3:
FIG. 3 is a diagram of the example high-voltage-tolerant level shifter of FIG. 2 in a first state.
Figure 3:
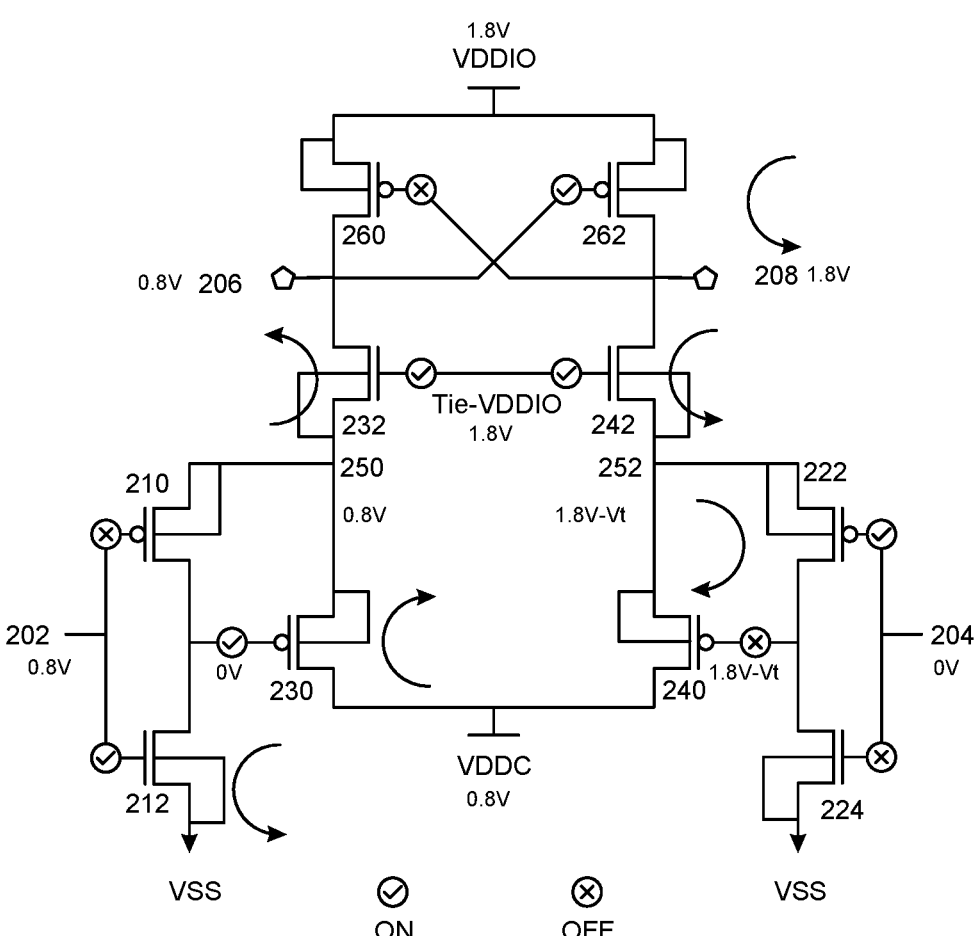

FIG. 3 is a diagram of high-voltage-tolerant level shifter 200 of FIG. 2 in a first scenario. As shown in FIG. 3, an input at 202 may be 0.8 V and an inverted input at 204 may be 0 V. Because device 212 is activated, device 230 may be enabled. Device 230 may assign VDDC (0.8V) to net 250, and device 232 may transfer 0.8 V to inverted output 206 (as the gate terminal for device 232 is at Tie-VDDIO, which may be 1.8 V). As the signal at output 206 is 0.8 V and it is connected to the gate of device 262, device 262 may be enabled and activated as its source terminal is at 1.8 V and may assign 1.8 V to output 208. Device 260 may be turned off as its gate and source terminals are at the same potential. Because both the gate and source terminals of device 242 are at 1.8 V, device 242 may transfer 1.8 V-Vt to net 252 (where Vt is the threshold voltage of the device). As may be appreciated, Vt may be high enough such that the difference between 1.8 V and Vt is less than or equal to the tolerance limit of the device (e.g., less than or equal to 1.5 V). Thus, in this example, Vt may be greater than or equal to 0.3 V. Since the signal at inverted input 204 is 0V, device 222 may be turned on and send 1.8 V-Vt to the gate terminal of device 240, thereby turning it off. As can be appreciated, none of the devices experience a voltage differential of greater than 1.5 V, even though various parts of level shifter 200 may be at 0 V or 1.8 V.

Figure 4:
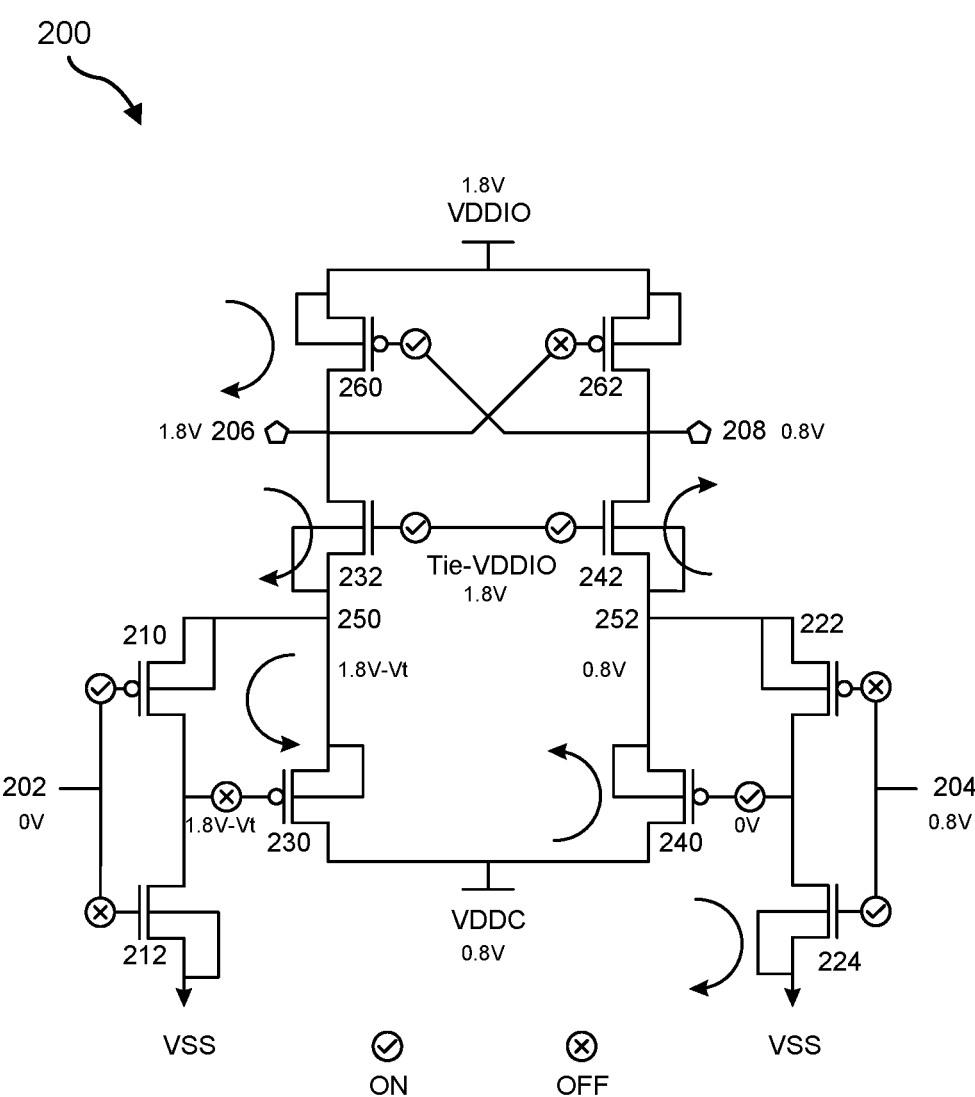
FIG. 4 is a diagram of the example high-voltage-tolerant level shifter of FIG. 2 in a second state.

FIG. 4 is a diagram of the high-voltage-tolerant level shifter 200 of FIG. 2 in a second scenario. As shown in FIG. 4, a signal at inverted input 204 may be 0.8 V and a signal at input 202 may be 0 V. Because device 224 is activated, device 240 may be enabled. Device 240 may assign VDDC (0.8 V) to net 252, and device 242 may transfer 0.8 V to output 208 (as the gate terminal for device 242 is at Tie-VDDIO, which may be 1.8 V). As the signal at output 208 is 0.8 V and it is connected to the gate of device 260, device 260 may be enabled and activated as its source terminal is at 1.8 V and may assign 1.8 V to inverted output 206. Device 262 may be turned off as its gate and source terminals are at the same potential. Because both the gate and source terminals of device 232 are at 1.8 V, device 232 may transfer 1.8 V-Vt to net 250. As may be appreciated, Vt may be high enough such that the difference between 1.8 V and Vt is less than or equal to the tolerance limit of the device (e.g., less than or equal to 1.5 V). Thus, in this example, Vt may be greater than or equal to 0.3 V. Since the signal at input 202 is 0 V, device 210 may be turned on and send 1.8 V-Vt to the gate terminal of device 230, thereby turning it off. As can be appreciated, none of the devices experience a voltage differential of greater than 1.5 V, even though various parts of level shifter 200 may be at 0 V or 1.8 V.

Figure 5:
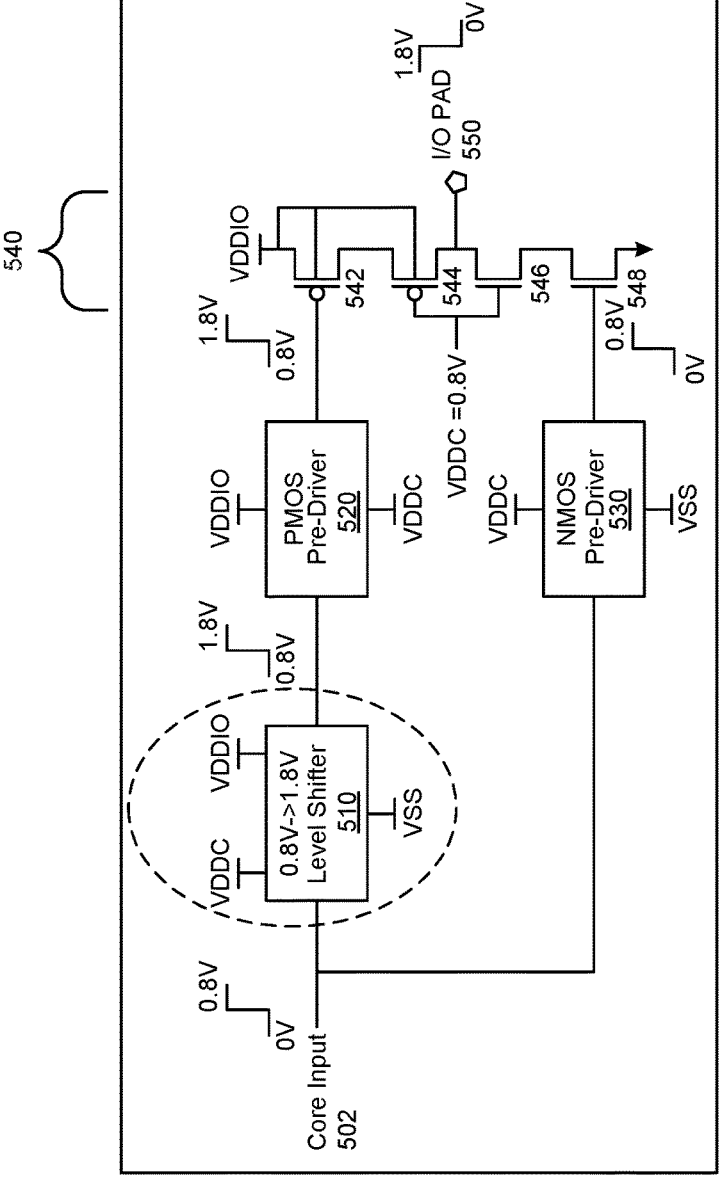
FIG. 5 is a diagram of an example system including a high-voltage tolerant level shifter.
Figure 5:
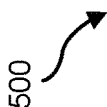

FIG. 5 is a diagram of an example system 500 including a high-voltage tolerant level shifter 510. In some examples, high-voltage tolerant level shifter 510 may be level shifter 200 of FIG. 2. As shown in FIG. 5, system 500 may include complementary pre-drivers (e.g., a PMOS pre-driver 520 and an NMOS pre-driver 530). System 500 may also include a output driver circuit 540, which may include PMOS devices 542 and 544 and NMOS devices 546 and 548. System 500 may receive a core input 502 and provide a level shifted signal to an I/O PAD 550. For example, core input 502 may be provided as input to level shifter 510 and to NMOS pre-driver 530. Level shifter 510 may shift the signal from a 0 V-0.8 V range to a 0.8 V to 1.8 V range. In some examples, the devices illustrated in system 500 of FIG. 5, including transistors used to implement level shifter 510, may not be tolerant of a voltage differential of 1.8 V, but level shifter 510 may shift the signal without over-stress on the devices within level shifter 510 or other devices within system 500. Level shifter 510 may thus produce a signal in a range from 0.8 V to 1.8 V. Output driver circuit 540 may provide the signal, in a range from 0 V to 1.8 V, to I/O PAD 550 without exposing any of devices 542, 544, 546, and 548 to a voltage differential of greater than 1.5 V.

A method of manufacture of a high-voltage tolerant level shifter may include dispose a plurality of transistors to form a level-shifter device (e.g., according to one or more of the layouts illustrated and/or described above) that is configured to shift an input signal from an input voltage range to an output voltage range, where a span from a bottom of the input voltage range to a top of the output voltage range is greater than a voltage differential tolerance of any of the plurality of transistors.

While the foregoing disclosure sets forth various implementations using specific block diagrams, flowcharts, and examples, each block diagram component, flowchart step, operation, and/or component described and/or illustrated herein can be implemented, individually and/or collectively, using a wide range of hardware, software, or firmware (or any combination thereof) configurations. In addition, any disclosure of components contained within other components should be considered example in nature since many other architectures can be implemented to achieve the same functionality.

The process parameters and sequence of steps described and/or illustrated herein are given by way of example only and can be varied as desired. For example, while the steps illustrated and/or described herein can be shown or discussed in a particular order, these steps do not necessarily need to be performed in the order illustrated or discussed. The various example methods described and/or illustrated herein can also omit one or more of the steps described or illustrated herein or include additional steps in addition to those disclosed.

While various implementations have been described and/or illustrated herein in the context of fully functional computing systems, one or more of these example implementations can be distributed as a program product in a variety of forms, regardless of the particular type of computer-readable media used to actually carry out the distribution. The implementations disclosed herein can also be implemented using modules that perform certain tasks. These modules can include script, batch, or other executable files that can be stored on a computer-readable storage medium or in a computing system. In some implementations, these modules can configure a computing system to perform one or more of the example implementations disclosed herein.

The preceding description has been provided to enable others skilled in the art to best utilize various aspects of the example implementations disclosed herein. This example description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A level-shifter device comprising a plurality of transistors, wherein:
   the level-shifter device is configured to shift an input signal from an input voltage range to an output voltage range,
   a span from a bottom of the input voltage range to a top of the output voltage range is greater than a voltage differential tolerance of any of the plurality of transistors,
   a top of the input voltage range corresponds to an input voltage domain,
   the level-shifter device comprises a pair of input buffers coupled to the input signal-,
   the level-shifter device comprises a pair of drain nets coupled respectively to the pair of input buffers, and
   the pair of drain nets are configured to each remain at a respective voltage range spanning from the input voltage domain and the voltage differential tolerance.

2. The level-shifter device of claim 1, wherein the plurality of transistors comprises a pair of cross-coupled field-effect transistors, wherein the pair of drain nets of the pair of cross-coupled field-effect transistors comprise a pair of complementary output nets of the level-shifter device.

3. The level-shifter device of claim 2, wherein a voltage source of the pair of cross-coupled field-effect transistors provides a voltage level at the top of the output voltage range.

4. The level-shifter device of claim 2, wherein the plurality of transistors comprises a pair of driving field-effect transistors with high voltage thresholds that activate the pair of cross-coupled field-effect transistors.

5. The level-shifter device of claim 4, wherein a voltage source of the pair of driving field-effect transistors provides a voltage level at the bottom of the output voltage range.

6. The level-shifter device of claim 4, wherein the pair of input buffers each comprise a buffering field-effect transistor, wherein a source and a bulk of the buffering field-effect transistor connects to a corresponding drain net of a corresponding transistor of the pair of driving field-effect transistors.

7. The level-shifter device of claim 1, wherein:

the input voltage range is from a ground voltage level to a core voltage level; and the output voltage range is from a core voltage level to an input/output voltage level.

8. The level-shifter device of claim 7, wherein:

the core voltage level is about 0.8 volts; and the input/output voltage level is about 1.8 volts.

9. The level-shifter device of claim 7, wherein the voltage differential tolerance is about 1.5 volts.

10. The level-shifter device of claim 1, wherein none of the plurality of transistors experiences voltage stress greater than the voltage differential tolerance when the level-shifter device is in operation.

11. A system comprising:

a level-shifter device comprising a plurality of transistors, wherein:

the level-shifter device is configured to shift an input signal from an input voltage range to an output voltage range, a span from a bottom of the input voltage range to a top of the output voltage range is greater than a voltage differential tolerance of any of the plurality of transistors, a top of the input voltage range corresponds to an input voltage domain, the level-shifter device comprises a pair of input buffers coupled to the input signal, the level-shifter device comprises a pair of drain nets coupled respectively to the pair of input buffers, and the pair of drain nets are configured to each remain at a respective voltage range spanning from the input voltage domain and the voltage differential tolerance;

a first pre-driver and a second pre-driver that is complementary to the first pre-driver, wherein an output of the level-shifter device is an input to the first pre-driver and the input signal is an input to the second pre-driver; and an output buffer circuit that receives outputs of the first and second pre-drivers as inputs and outputs a conditioned signal to an input/output pad.

12. The system of claim 11, wherein the plurality of transistors comprises a pair of cross-coupled field-effect transistors, wherein the pair of drain nets of the pair of cross-coupled field-effect transistors comprise a pair of complementary output nets of the level-shifter device.

13. The system of claim 12, wherein a voltage source of the pair of cross-coupled field-effect transistors provides a voltage level at the top of the output voltage range.

14. The system of claim 12, wherein the plurality of transistors comprises a pair of driving field-effect transistors that activate the pair of cross-coupled field-effect transistors.

15. The system of claim 14, wherein a voltage source of the pair of driving field-effect transistors provides a voltage level at the bottom of the output voltage range.

16. The system of claim 14, wherein the pair of input buffer stages each comprise a buffering field-effect transistor, wherein a source and a bulk of the buffering field-effect transistor connects to a corresponding drain net of a corresponding transistor of the pair of driving field-effect transistors.

17. The system of claim 11, wherein:

the input voltage range is from a ground voltage level to a core voltage level; and the output voltage range is from a core voltage level to an input/output voltage level.

18. The system of claim 17, wherein:

the core voltage level is about 0.8 volts; and the input/output voltage level is about 1.8 volts.

19. The system of claim 17, wherein the voltage differential tolerance is about 1.5 volts.

20. A method of manufacture, comprising disposing a plurality of transistors to form a level-shifter device that is configured to shift an input signal from an input voltage range to an output voltage range, wherein:

a span from a bottom of the input voltage range to a top of the output voltage range is greater than a voltage differential tolerance of any of the plurality of transistors, a top of the input voltage range corresponds to an input voltage domain, the level-shifter device further comprises a pair of input buffers coupled to the input signal, the level-shifter device comprises a pair of drain nets coupled respectively to the pair of input buffers, and the pair of drain nets are configured to each remain at a respective voltage range spanning from the input voltage domain and the voltage differential tolerance.

* * * * *